United States Patent
Chang

(10) Patent No.: US 11,316,547 B2
(45) Date of Patent: Apr. 26, 2022

(54) SIGNAL GENERATION CIRCUIT AND RELATED CHIP, FLOW METER AND METHOD

(71) Applicant: SHENZHEN GOODIX TECHNOLOGY CO., LTD., Guangdong (CN)

(72) Inventor: Jung-Yu Chang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 87 days.

(21) Appl. No.: 16/878,331

(22) Filed: May 19, 2020

(65) Prior Publication Data
US 2020/0280327 A1 Sep. 3, 2020

Related U.S. Application Data

(63) Continuation of application No. PCT/CN2019/072261, filed on Jan. 18, 2019.

(51) Int. Cl.
*H04B 1/04* (2006.01)
*H04J 1/08* (2006.01)
*H04B 17/17* (2015.01)

(52) U.S. Cl.
CPC .............. *H04B 1/0475* (2013.01); *H04J 1/08* (2013.01); *H04B 17/17* (2015.01)

(58) Field of Classification Search
CPC ...... H04J 1/02; H04J 1/08; H04B 1/02; H04B 1/04; H04B 1/0475; H04B 17/00;
(Continued)

(56) References Cited

U.S. PATENT DOCUMENTS 4,896,318 A * 1/1990 Kokubo ................ H04B 3/232
370/289
5,365,235 A * 11/1994 Kennedy ............... G01S 13/758
340/10.34
(Continued)

FOREIGN PATENT DOCUMENTS

CN      101988965 A      3/2011
CN      104604145     *  7/2012    ............. H04B 1/525
(Continued)

OTHER PUBLICATIONS

English Abstract Translation of Foreign Reference CN101988965A.
(Continued)

*Primary Examiner* — Warner Wong
(74) *Attorney, Agent, or Firm* — Wpat, P.C., Intellectual Property Attorneys; Anthony King

(57) ABSTRACT

The application discloses a signal generation circuit (100), configured to generate a transmission signal to trigger a first transducer to generate a first transducer output signal; the signal generation circuit includes: a signal generation unit (106), configured to generate an output signal; and a transmitter (104), coupled to the signal generation unit, wherein the transmitter is configured to convert the output signal into the transmission signal; wherein the transmission signal includes a data signal and a compensation signal, the data signal includes at least one first pulse wave, the compensation signal includes at least one second pulse wave, the first pulse wave and the second pulse wave have opposite phases, and the first pulse wave has an other waveform parameter different from an other waveform parameter of the second pulse wave. The present application further provides a related chip, a flow meter and a method.

20 Claims, 11 Drawing Sheets

(58) Field of Classification Search
CPC .......... H04B 17/16; H04B 17/17; H04B 1/12; H04B 1/123
See application file for complete search history.

(56) References Cited

U.S. PATENT DOCUMENTS

| | | | | |
|---|---|---|---|---|
| 5,483,501 | A | * | 1/1996 | Park .................. G01S 7/521 367/140 |
| 2011/0026365 | A1 | | 2/2011 | Beckhoven et al. |
| 2012/0068574 | A1 | * | 3/2012 | Wu .................. G10K 11/002 310/314 |
| 2013/0243045 | A1 | * | 9/2013 | Hayashi .............. H04L 27/38 375/297 |
| 2016/0120515 | A1 | | 5/2016 | Arai |
| 2016/0173981 | A1 | * | 6/2016 | Koudar .................. G01S 3/86 367/140 |

FOREIGN PATENT DOCUMENTS

| | | |
|---|---|---|
| CN | 103580682 A | 2/2014 |
| CN | 106908777 A | 6/2017 |
| CN | 108061895 A | 5/2018 |
| EP | 3109664 A1 | 12/2016 |
| JP | 2013211617 * 3/2012 | ............... H04B 1/04 |
| KR | 1 020180052034 | 5/2018 |

OTHER PUBLICATIONS

English Abstract Translation of Foreign Reference CN103580682A.
English Abstract Translation of Foreign Reference CN106908777A.
English Abstract Translation of Foreign Reference CN108061895A.
International Searching Authority (ISA) Form 210—International Search Report.
International Searching Authority (ISA) Form 220—Notification of Transmittal of the International Search Report.
International Searching Authority (ISA) Form 237—Written Opinion.
As-filed PCT Request of PCT/CN2019/072261.
As-filed PCT Application of PCT/CN2019/072261.
Receipt for the filing of PCT/CN2019/072261.
Notification of Receipt of Search Copy in Chinese (Form PCT/ISA/202) of PCT/CN2019/072261.
Notification of Receipt of Record Copy (Form PCT/IB/301) of PCT/CN2019/072261.

* cited by examiner

SIGNAL GENERATION CIRCUIT AND RELATED CHIP, FLOW METER AND METHOD

CROSS-REFERENCE TO RELATED APPLICATIONS

This application is a continuation of International Application No. PCT/CN2019/072261, filed on Jan. 18, 2019, the disclosure of which is hereby incorporated by reference in its entirety.

TECHNICAL FIELD

The present application relates to a signal generation circuit; in particular, to a signal generation circuit for use in triggering a transducer, and a related chip, a flow meter and a method.

BACKGROUND

After a transducer is triggered by an input signal, it will vibrate and generate signal waves. For example, when an input string of signals containing five pulse waves are inputted, the output signal of the transducer should ideally also contain only five pulse waves; however, the device itself will have some residual energy, so in general, the output signal will additionally generate a series of vibrations after said five pulse waves. If the additional vibration continues for too long, it will adversely affect the signal processing at the receiving end; for example, the hardware cost and processing time will increase. In addition, because the input of the next string of signals to the transducer only begins after the reception of the additional vibration is completed, the longer the waiting time, the more disadvantageous it is in application. In view of this, further improvements and innovations are needed to address the above-mentioned issues.

SUMMARY OF THE INVENTION

One of the purposes of the present application is directed to a signal generation circuit for triggering a transducer and a related chip, a flow meter and a method to address the above-mentioned issues.

One embodiment of the present application discloses a signal generation circuit, which is configured to generate a transmission signal to trigger a first transducer to generate a first transducer output signal, wherein the signal generation circuit includes: a signal generation unit, configured to generate an output signal; and a transmitter, coupled to the signal generation unit, wherein the transmitter is configured to convert the output signal into the transmission signal; wherein the transmission signal includes a data signal and a compensation signal, wherein the data signal includes at least one first pulse wave, and the compensation signal includes at least one second pulse wave, wherein the first pulse wave and the second pulse wave have opposite phases, and the first pulse wave has an other waveform parameter different from an other waveform parameter of the second pulse wave.

One embodiment of the present application discloses a chip, includes the above-mentioned signal generation circuit.

One embodiment of the present application discloses a flow meter, includes the above-mentioned signal generation circuit; the above-mentioned first transducer; and the above-mentioned second transducer; wherein the signal generation circuit is coupled to the above-mentioned first transducer and the above-mentioned second transducer.

One embodiment of the present application discloses a signal generate method for generating a transmission signal to trigger a first transducer to generate a first transducer output signal, wherein the signal generation method includes: generating an output signal; and converting the output signal into the transmission signal; wherein the transmission signal includes a data signal and a compensation signal, and the data signal includes at least one first pulse wave, and the compensation signal includes at least one second pulse wave, wherein the first pulse wave and the second pulse wave have opposite phases, and the first pulse wave has an other waveform parameter different from an other waveform parameter of the second pulse wave.

The signal generation circuit for triggering a transducer and a related chip, a flow meter and a method according to the present application allow the transducer to have less additional vibration when being triggered, so as to improve the operation frequency, performance and accuracy thereof.

DETAILED DESCRIPTION

Figure 1:
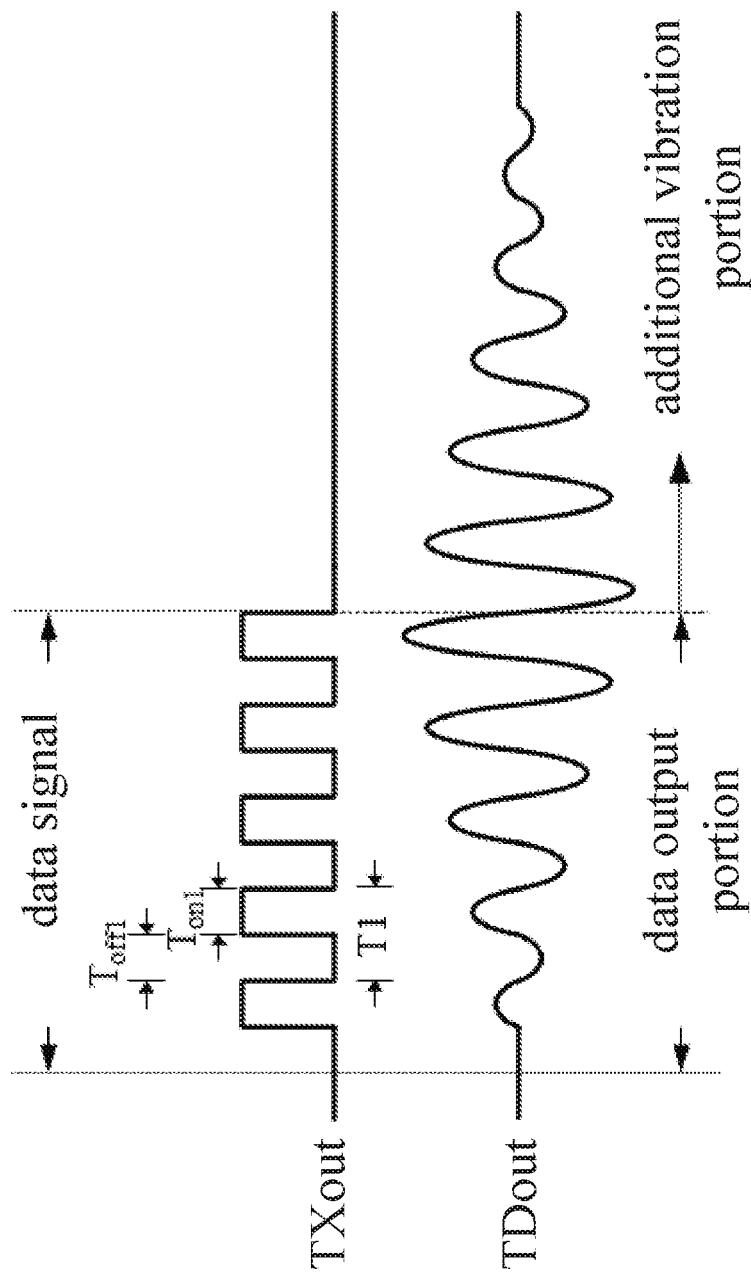
FIG. 1 shows the waveforms of the output signal generated in the time domain when the transducer is triggered by the input signal

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for the ease of the description to describe one element or feature's relationship with respect to another element(s) or feature(s) as illustrated in the drawings. The spatially relative terms are intended to encompass different orientations of the device in use or operation in addition to the orientation depicted in the figures. The apparatus may be otherwise oriented (e.g., rotated by 90 degrees or at other orientations) and the spatially relative descriptors used herein may likewise be interpreted accordingly.

Notwithstanding that the numerical ranges and parameters setting forth the broad scope of the application are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. As could be appreciated, other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The transducer is a component capable of transforming energy from one form into another form. These energy forms may include electric energy, mechanic energy, electromagnetic energy, solar energy, chemical energy, acoustic energy and thermal energy, etc.; however, the present application is not limited thereto, and the transducer may include any component capable of transforming energy.

Reference is made to FIG. 1; specifically, when a transducer is triggered by an input signal TXout, an output signal TDout is generated correspondingly; in the present application, the input signal TXout includes a data signal; in FIG. 1, the data signal of input signal TXout has a plurality of (five) first pulse waves; however, the present application is not limited thereto, as long as the number of the first pulse wave of the data signal of the input signal TXout is greater than or equal to 1. The period of each of the plurality of first pulse wave is T1, and the period T1 includes a high-level time $T_{on1}$ and a low-level time $T_{off1}$.

Generally, the output signal TDout corresponding to the input signal TXout includes a data output portion and an additional vibration portion, wherein the additional vibration portion is formed by the residual energy of the transducer and continues the data output portion in a time domain. The time length of the data output portion and the time length of the data signal are the same. It should be noted that, in the present application, the expression of "the same" may refer to "substantially the same;" that is, there may be an acceptable standard deviation, and this applies to all the similar description hereinbelow. The time length of the additional vibration portion depends on the Q value of the transducer; when the additional vibration portion time length lasts too long, an adverse effect shows.

Figure 2:
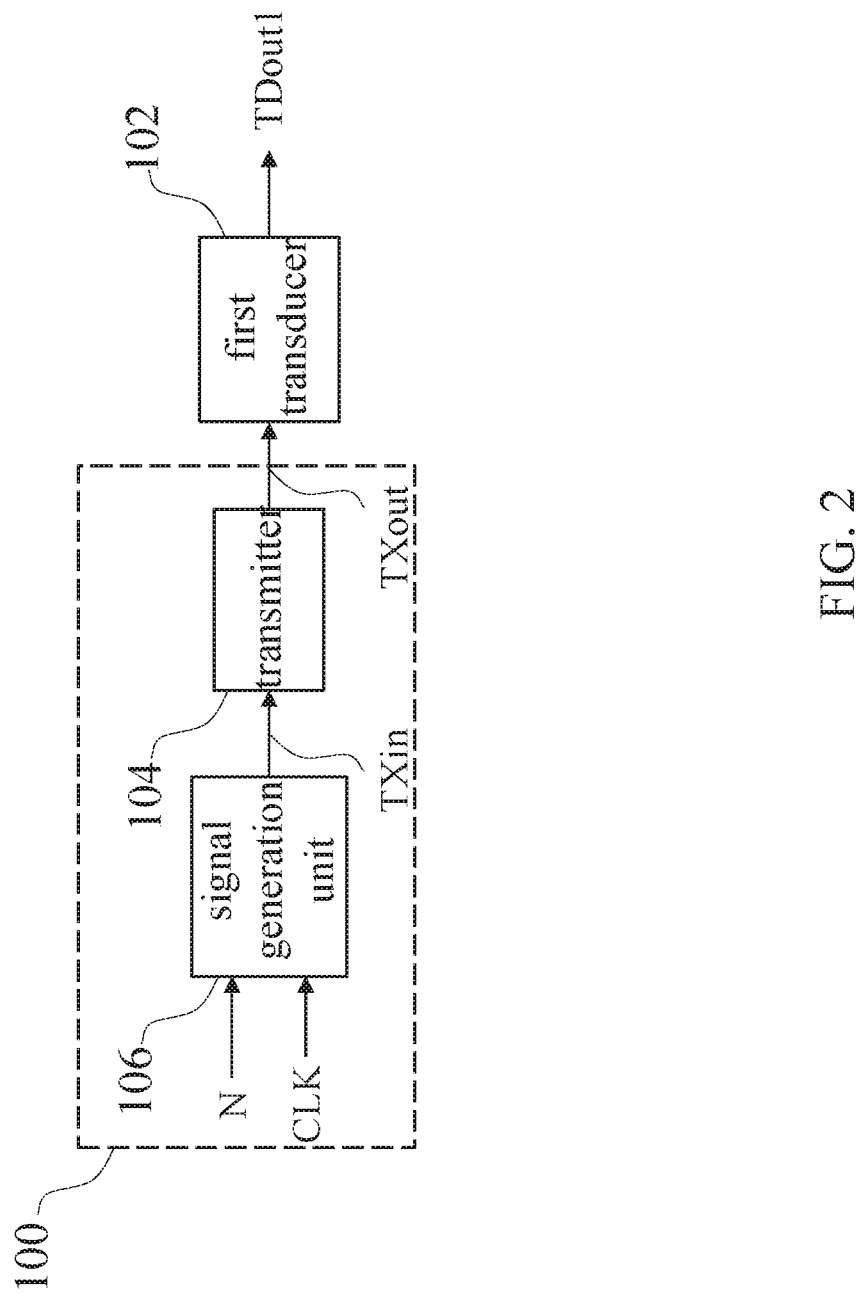
FIG. 2 is a schematic diagram illustrating the present signal generation circuit, according to embodiments of the present application.

FIG. 2 is a schematic diagram illustrating the signal generation circuit 100, according to embodiments of the present application. The signal generation circuit 100 is configured to generate a transmission signal TXout to trigger a first transducer 102, wherein the first transducer 102, upon being triggered, generates a first transducer output signal TDout1. The signal generation circuit 100 includes a signal generation unit 106 and a transmitter 104, wherein the signal generation unit 106 is configured to generate an output signal TXin according to a specific parameter N and a specific clock. The input terminus of the transmitter 104 is coupled to the output terminus of the signal generation unit 106, and the transmitter 104 is configured to convert the output signal TXin into the transmission signal TXout.

In the present embodiment, in addition to the data signal, the transmission signal TXout further includes a compensation signal, wherein the compensation signal is configured to reduce the time length consumed by the additional vibration portion in the first transducer output signal TDout1 to decrease from a peak value to a predetermined level. The data signal includes at least one first pulse wave, and the compensation signal includes at least one second pulse wave. Several possible compensation signals are further discussed below in connection with drawings.

Figure 3:
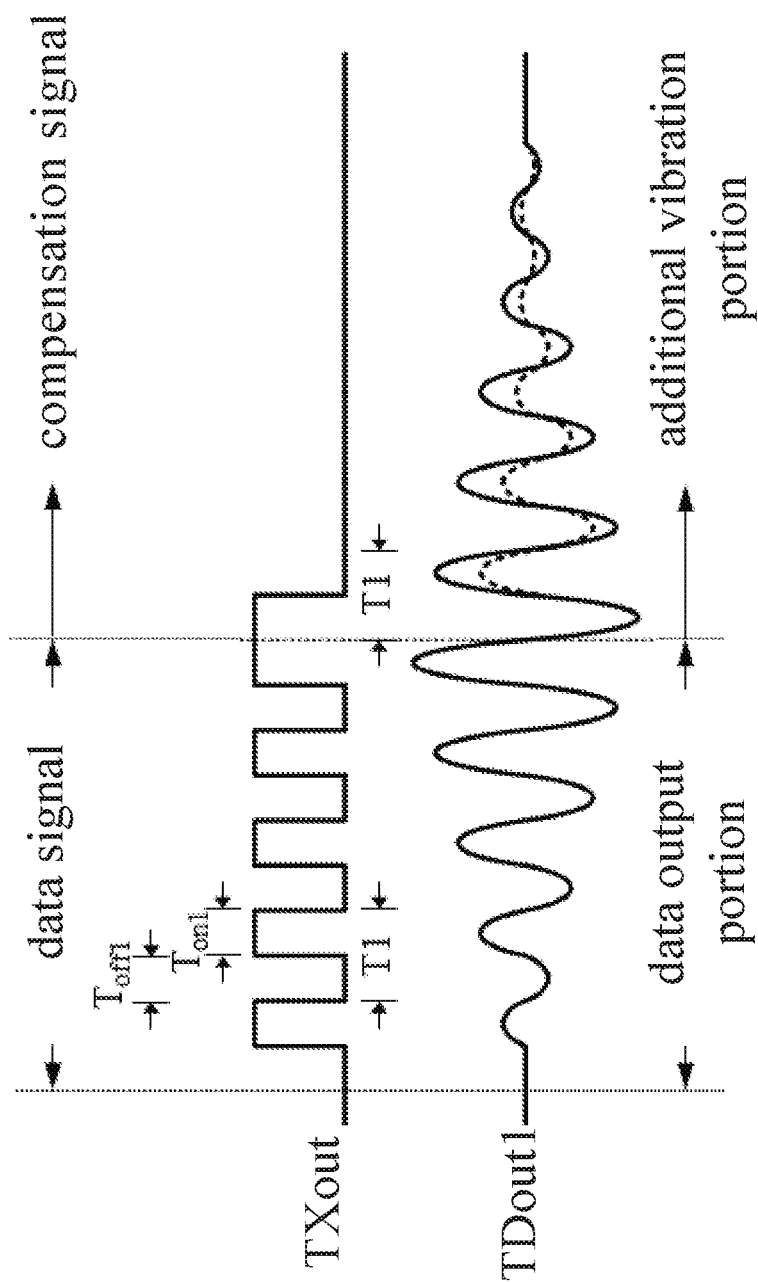
FIG. 3 shows the waveforms of the transmission signal generated by the present signal generation circuit and the first transducer output signal generated by the transmission signal passing through the first transducer in a time domain, according to the first embodiment of the present disclosure.

FIG. 3 shows the waveforms of the transmission signal TXout generated by the signal generation circuit 100 and the first transducer output signal TDout1 generated by the transmission signal TXout passing through the first transducer 102 in the time domain, according to the first embodiment of the present disclosure. The period of each first pulse wave of the data signal is T1, and the period T1 includes a high-level time length $T_{on1}$ of a high level (logic "1") and low-level time length $T_{off1}$ of a low level (logic "0"). In the present embodiment, the low level (logic "0") of the first pulse wave of the data signal precedes the high level (logic "1"); however, the present application is not limited thereto. The compensation signal includes a second pulse wave, wherein the second pulse wave and the first pulse wave have a phase difference of 180 degrees; i.e., the second pulse wave and the first pulse wave have opposite phases; and, the two have the same period T1, and all the other waveform parameters (such as, the duty cycle, slew rate, amplitude and frequency) are the same. As could be seen in FIG. 3, after the last first pulse wave of the data signal, a second pulse wave of the compensation signal having an opposite phase with respect to the first pulse wave follows immediately; in contrast, in the present embodiment, the high level (logic "1") of the second pulse wave precedes the low level (logic "0"); however, the present application is not limited thereto, as long as the second pulse wave is configured to have a phase difference of 180 degrees with respect to the first pulse wave. Moreover, the present application does not put any particular limitation on the waveform of the data signal and the compensation signal; that is, the first pulse wave and the second pulse wave can be a square wave, triangle wave, sine wave, or any other form. Compared with the additional vibration portion generated when no compensation signal is incorporated (the solid line portion of the additional vibration portion), the additional vibration portion generated after the incorporation of the compensation signal (the dashed line portion of the additional vibration portion) has an amplitude that can be lowered to a predetermined level during a shorter period of time.

Figure 4:
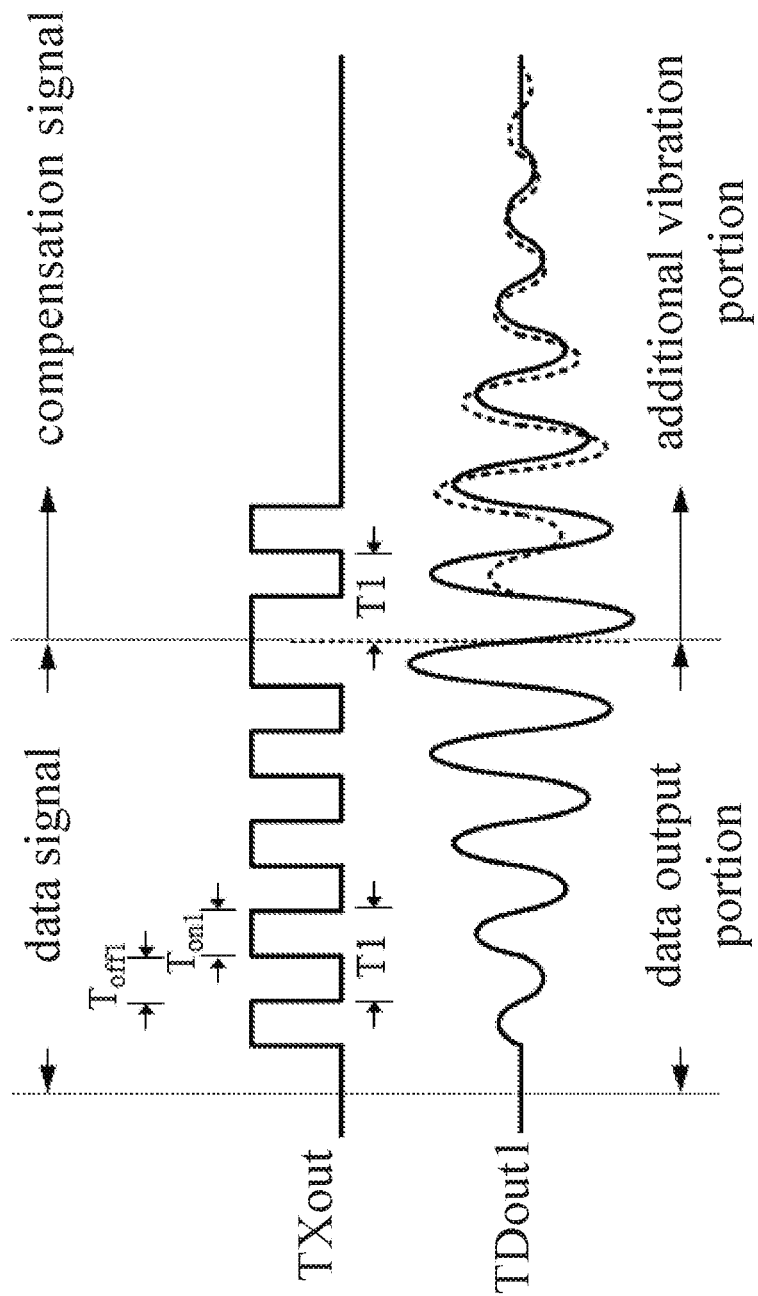
FIG. 4 shows the waveforms of the transmission signal generated by the present signal generation circuit and the first transducer output signal generated by the transmission signal passing through the first transducer in a time domain, according to the second embodiment of the present disclosure.

Since the additional vibration portion in FIG. 3 is not eliminated completely (which is likely due to insufficient energy of the compensation signal), it is feasible to increase the compensation signal. FIG. 4 shows the waveforms of the transmission signal TXout generated by the present signal generation circuit 100 and the first transducer output signal TDout1 generated by the transmission signal passing through the first transducer 102 in a time domain, according to the second embodiment of the present disclosure. The present embodiment differs from the case depicted in FIG. 3 in that the compensation signal includes two second pulse waves, wherein both the second pulse waves have a phase difference of 180 degrees with respect to the first pulse wave; that is, the two second pulse waves have a phase opposite to the phase of the first pulse wave, and have the same period T1 and other waveform parameters (such as, duty cycle, slew rate, amplitude and frequency). As could be seen in FIG. 4, compared with the additional vibration portion generated when no compensation signal is incorporated (the solid line portion of the additional vibration portion), although the additional vibration portion of the second one of the second pulse waves of the compensation signal (the dashed line portion of the additional vibration portion) may decrease drastically in the beginning, the amplitude of the additional vibration portion may increase due to the excessive energy of the second one of the second pulse waves of the compensation signal.

Figure 5:
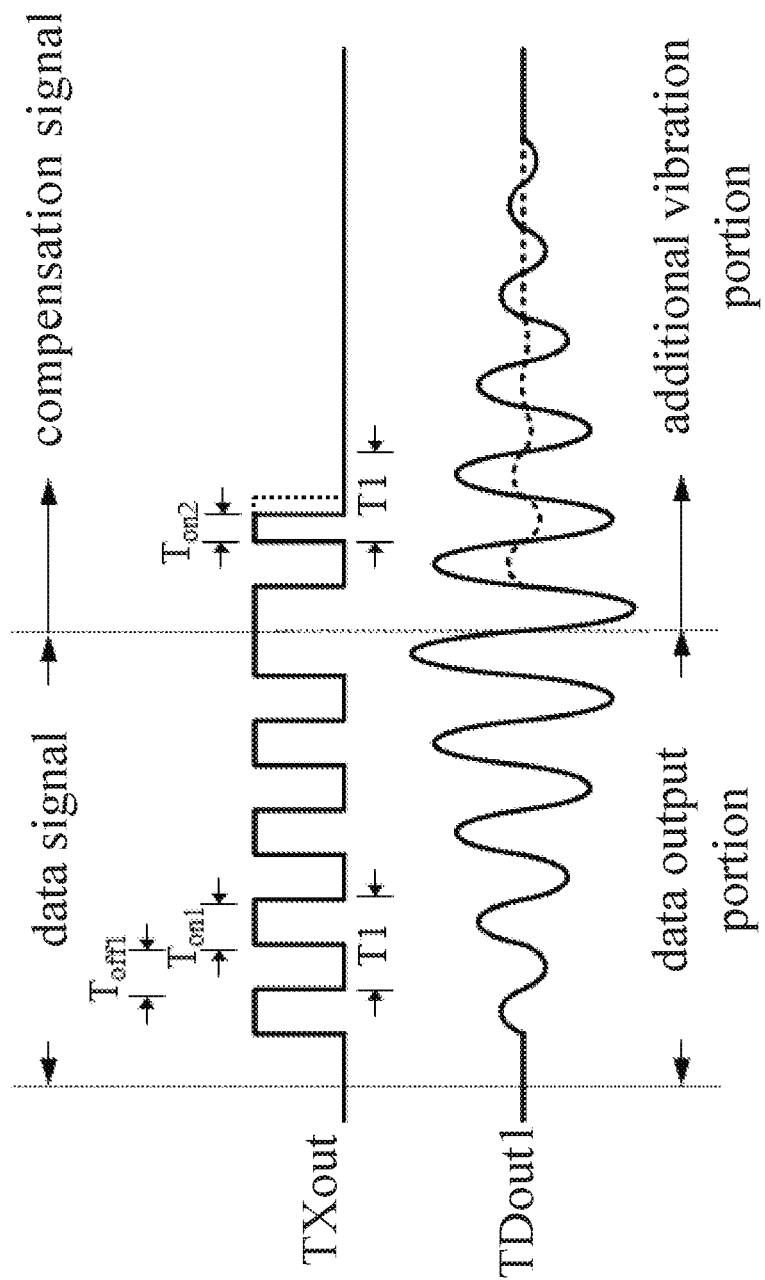
FIG. 5 shows the waveforms of the transmission signal generated by the present signal generation circuit and the first transducer output signal generated by the transmission signal passing through the first transducer in a time domain, according to the third embodiment of the present disclosure.

In order to solve the issue seen in FIG. 4, a more delicate adjustment to the compensation signal is needed. FIG. 5 shows the waveforms of the transmission signal TXout generated by the present signal generation circuit 100 and the first transducer output signal TDout1 generated by the transmission signal passing through the first transducer 102 in a time domain, according to the third embodiment of the present application. The embodiment shown in FIG. 5 differs from the case depicted in FIGS. 3 and 4 in that the duty cycles of the second pulse wave of the compensation signal can be adjusted, so as to address the issue seen in FIG. 4 that the energy of the second one of the second pulse waves is too great. In other words, in FIG. 5, the two second pulse waves still have a phase difference of 180 degrees with respect to the first pulse wave, the same period T1; yet, their duty cycle, one of the waveform parameters, differs from each other; for example, in FIG. 5, the second one of the second pulse waves has a high-level time length $T_{on2}$, which is less than the high-level time length $T_{on1}$ of the first pulse wave of the data signal. As could be seen in FIG. 5, compared with the additional vibration portion generated after the incorporation of the compensation signal shown in FIG. 3 (the dashed line portion of the additional vibration portion), in FIG. 5, the additional vibration portion generated after the incorporation of the compensation signal (the dashed line portion of the additional vibration portion) may have an amplitude that can be lowered to a predetermined level during a shorter period of time.

It should be noted that the number of the second pulse wave of the compensation signal is not particularly limited in the present application, and it is feasible to adjust the duty cycle of part or all of the plurality of second pulse waves of the compensation signal with different levels of adjustment.

Figure 6:
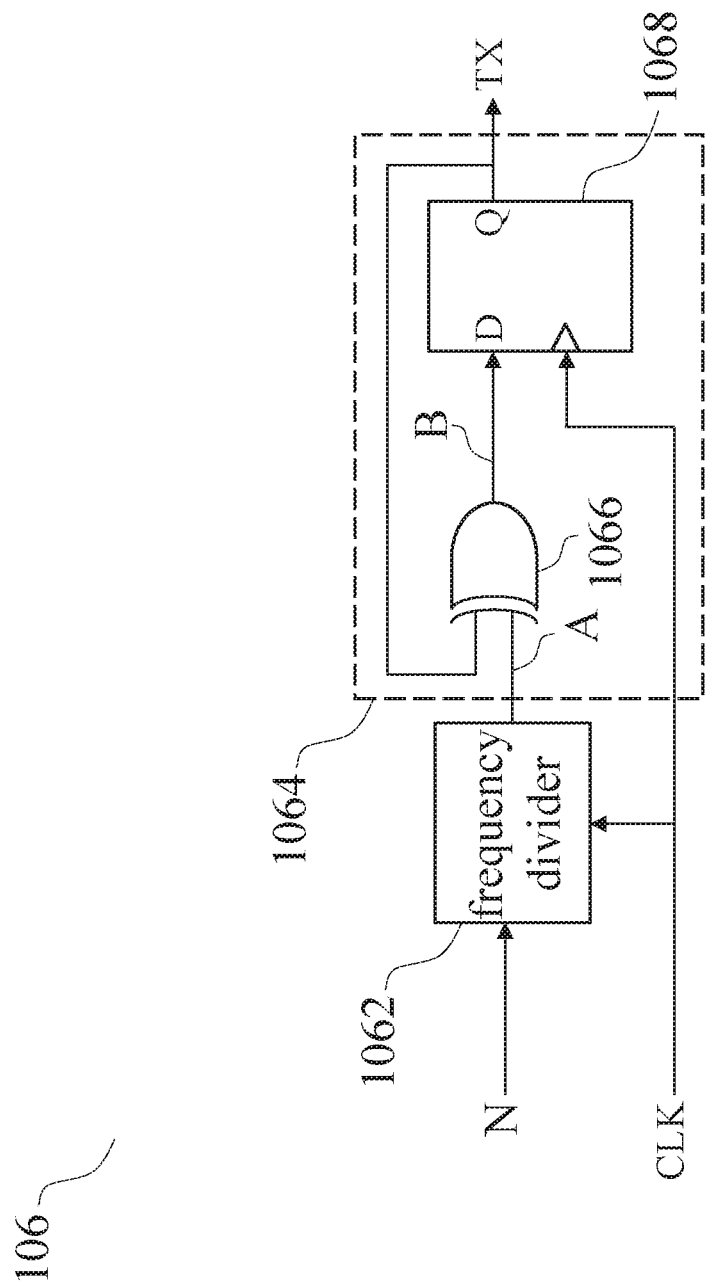
FIG. 6 is a schematic diagram illustrating the signal generation circuit, according to embodiments of the present application.
Figure 7:
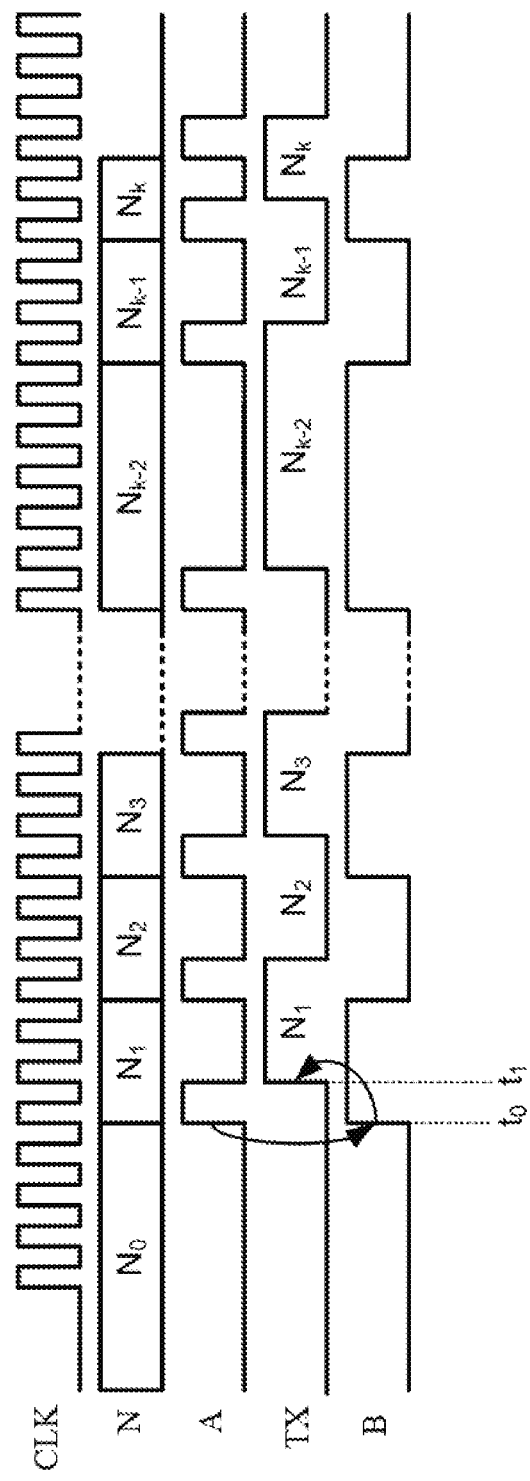
FIG. 7 shows the waveforms in the time domain during the operation of the signal generation unit.

FIG. 6 is a schematic diagram illustrating a signal generation unit 106 according to embodiments of the present application. FIG. 6 is a signal generation unit 106 that can be used as the signal generation circuit 100 of FIG. 2 for generating the transmission signal TXout of FIG. 5, it should be noted that the implementation of the signal generation unit 106 is not limited to the embodiment of FIG. 6, as long as they can achieve equivalent functions. Reference is also made to FIG. 7, which shows that the signal generation unit 106 includes a frequency divider 1062 and a computation unit 1064. In this embodiment, the frequency divider 1062 is configured to divide the frequency of the specific clock CLK according to the specific multiple N ($N_0, N_1, \ldots, N_k$) and generate a frequency-division signal A; for example, the frequency divider 1062 can be a counter; however, the present application is not limited thereto. The signal generation unit 106 further uses the computation unit 1064 to convert the frequency-division signal A into the output signal TXin.

Specifically, the computation unit 1064 includes an exclusive OR circuit 1066 and a trigger circuit 1068. For example, the trigger circuit 1068 can be a D trigger circuit; however, the present application is not limited thereto. The exclusive OR circuit 1066 includes a first input terminus, a second input terminus and an output terminus; the trigger circuit 1068 includes a clock input terminus, a data input terminus D and an output terminus Q, wherein the output terminus Q of the trigger circuit 1068 is coupled to the first input terminus of the exclusive OR circuit 1066; the second input terminus of the exclusive OR circuit 1066 is coupled to a frequency-division signal A; the clock input terminus of the trigger circuit 1068 is coupled to the specific clock CLK; the data input terminus D of the trigger circuit 1068 is coupled to the output terminus of the exclusive OR circuit 1066; and the output signal TXin is outputted from the output terminus Q of the trigger circuit 1068.

The present embodiment uses the period of the clock CLK as the unit to adjust the duty cycle of the second one of the second pulse waves; that is, the high-level time length of the second one of the second pulse waves is adjusted so that the energy of the compensation signal is close to the residual energy of the transducer as much as possible, in order to avoid insufficient compensation or overcompensation, and hence, the amplitude of the additional vibration portion can be lowered to the predetermined level in a shorter period of time. In this case, when the divisor satisfies the value of a specific multiple N, the frequency-division signal A outputted by the frequency divider 1062 could switch to a high level (logic "1") from a low level (logic "0"), which will last for the period of one clock CLK. Take time $t_0$ as an example, when the frequency divider 1062 satisfies the specific multiple $N_0$, the frequency-division signal A switches from the low level into the high level; in the meantime, the output signal TXin and the output B of the exclusive OR circuit 1066 also switches from the low level into the high level; next, during the next clock CLK period (time $t_1$), the trigger circuit 1068 also switches from the low level into the high level. Since the frequency-division signal A has already switched from the high level into the low level at time $t_1$, the output B of the exclusive OR circuit 1066 maintains at the high level and will only convert until the frequency divider 1062 satisfies the next specific multiple $N_1$ (such as, 3). In this way, it is feasible to change the high-level time length of the second pulse wave of the compensation signal by adjusting the specific multiple, and in this embodiment, the specific multiple $N_1 \sim N_{k-3}$ is 3, the specific multiple $N_{k-2}$ is 6, the specific multiple $N_{k-1}$ is 3, and the specific multiple $N_k$ is 2. Therefore, the high-level time length of the first pulse wave of the data signal is the first multiple (such as, 3) of the period of the clock CLK, the high-level time length of the second pulse wave of the compensation signal is the second multiple (such as, 2) of the period of the clock CLK, and the first multiple and the second multiple may be different positive integers.

Figure 8:
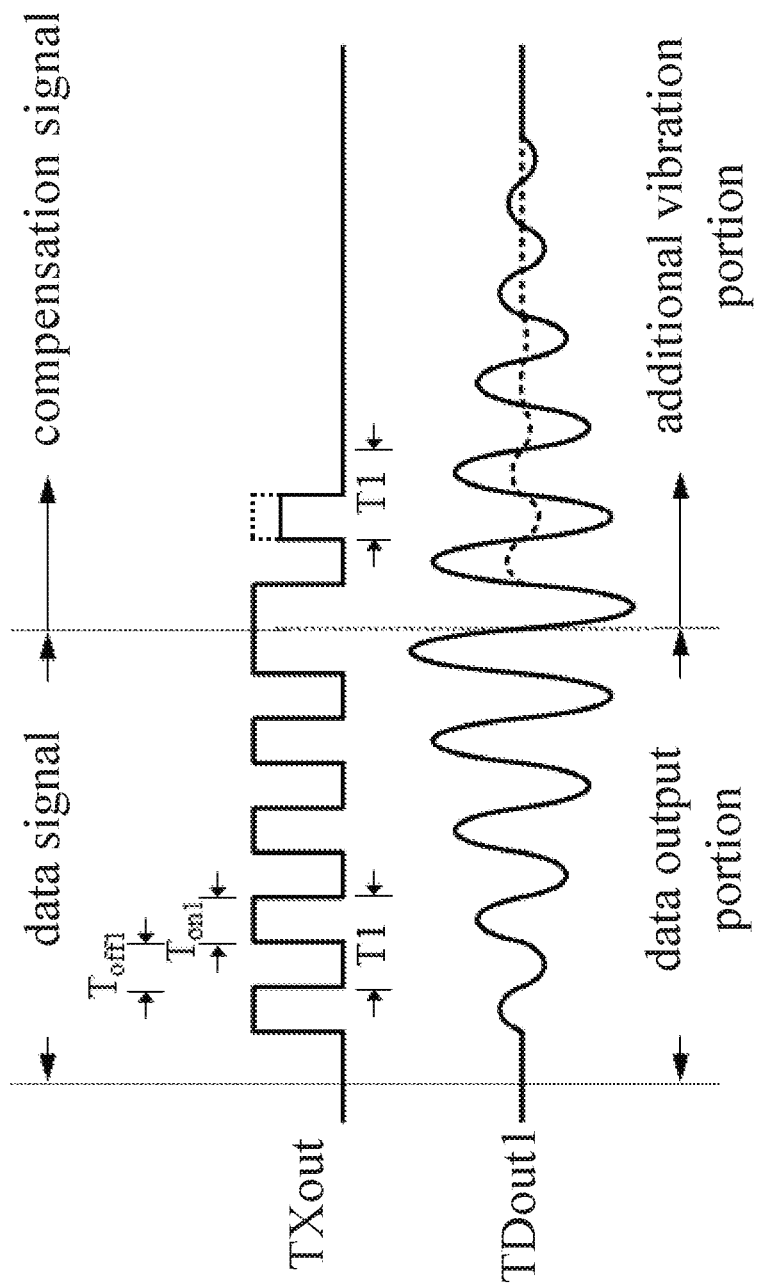
FIG. 8 shows the waveforms of the transmission signal generated by the present signal generation circuit and the first transducer output signal generated by the transmission signal passing through the first transducer in a time domain, according to the fourth embodiment of the present disclosure.

FIG. 8 shows the waveforms of the transmission signal TXout generated by the present signal generation circuit 100 and the first transducer output signal TDout1 generated by the transmission signal passing through the first transducer 102 in a time domain, according to the fourth embodiment of the present disclosure. The embodiment shown in FIG. 8 differs from the case depicted in FIGS. 3 and 4 in that the amplitude of the second pulse wave of the compensation signal can be adjusted, so as to address the issue seen in FIG. 4 that the energy of the second one of the second pulse waves is too great. In other words, in FIG. 8, the two second pulse waves still have a phase difference of 180 degrees with respect to the first pulse wave, the same period T1; yet, their amplitude, one of the waveform parameters, differs from each other; for example, in FIG. 8, the second one of the second pulse waves has an amplitude smaller than the amplitude of the first pulse wave of the data signal. As could be seen in FIG. 8, compared with the additional vibration portion generated after the incorporation of the compensation signal shown in FIG. 3 (the dashed line portion of the additional vibration portion), in FIG. 8, the additional vibration portion generated after the incorporation of the compensation signal (the dashed line portion of the additional vibration portion) may have an amplitude that can be lowered to a predetermined level during a shorter period of time.

It should be noted that the number of the second pulse wave of the compensation signal is not particularly limited in the present application, and it is feasible to adjust the amplitude of part or all of the plurality of second pulse waves of the compensation signal with different levels of adjustment.

Figure 9:
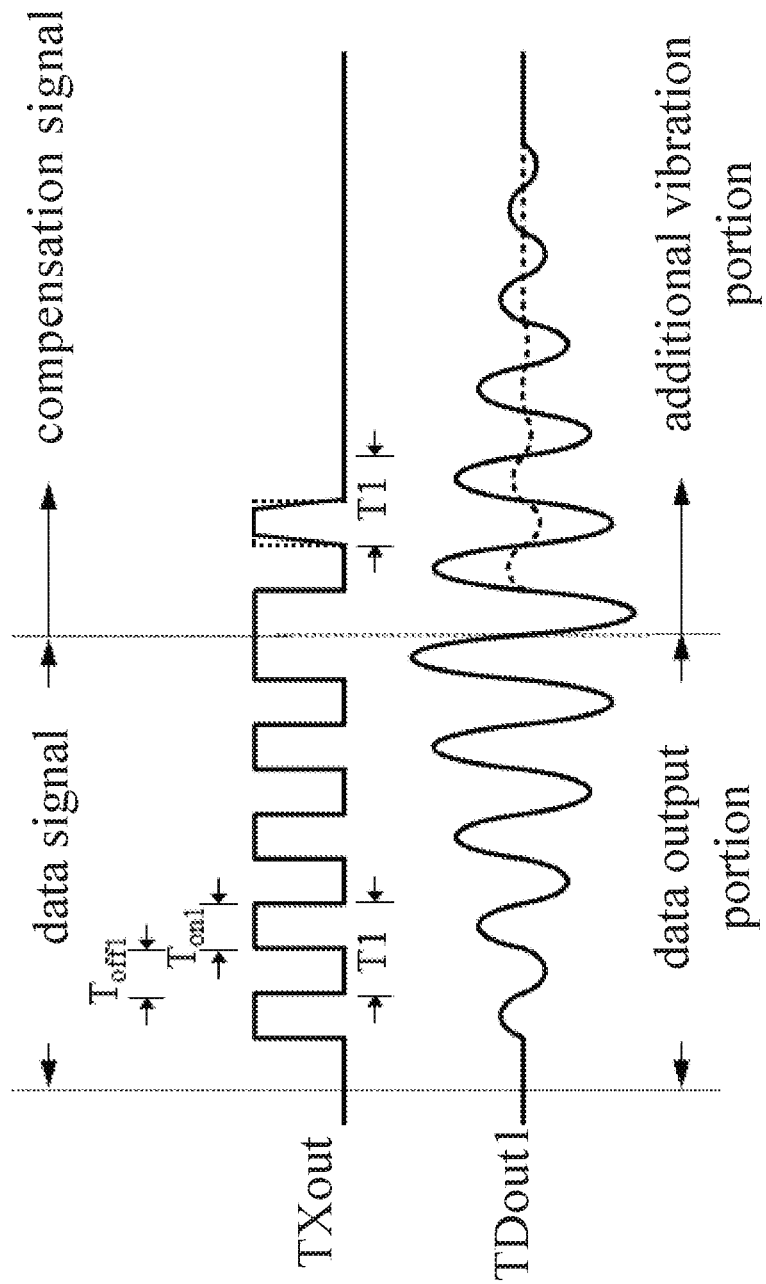
FIG. 9 shows the waveforms of the transmission signal generated by the present signal generation circuit and the first transducer output signal generated by the transmission signal passing through the first transducer in a time domain, according to the fifth embodiment of the present disclosure.

FIG. 9 shows the waveforms of the transmission signal TXout generated by the present signal generation circuit 100 and the first transducer output signal TDout1 generated by the transmission signal passing through the first transducer 102 in a time domain, according to the fifth embodiment of the present application. The embodiment shown in FIG. 9 differs from the case depicted in FIGS. 3 and 4 in that the slew rate of the second pulse wave of the compensation signal can be adjusted, so as to address the issue seen in FIG. 4 that the energy of the second one of the second pulse waves is too great. In other words, in FIG. 9, the two second pulse waves still have a phase difference of 180 degrees with respect to the first pulse wave, the same period T1; yet, their slew rate, one of the waveform parameters, differs from each other; for example, in FIG. 9, the second one of the second pulse waves has a slew rate smaller than the slew rate of the first pulse wave of the data signal. It should be noted that the slew rate can be adjusted separately for the rising and falling edges; for example, the slew rate of the rising edge can be equal to the slew rate of the falling edge, and additionally, the slew rate of the rising edge can be smaller than the slew rate of the falling edge, or the slew rate of the rising edge can also be greater than the slew rate of the falling edge. As could be seen in FIG. 9, compared with the additional vibration portion generated after the incorporation of the compensation signal shown in FIG. 3 (the dashed line portion of the additional vibration portion), in FIG. 9, the additional vibration portion generated after the incorporation of the compensation signal (the dashed line portion of the additional vibration portion) may have an amplitude that can be lowered to a predetermined level during a shorter period of time.

It should be noted that the number of the second pulse wave of the compensation signal is not particularly limited in the present application, and it is feasible to adjust the slew rate of part or all of the plurality of second pulse waves of the compensation signal with different levels of adjustment.

Figure 10:
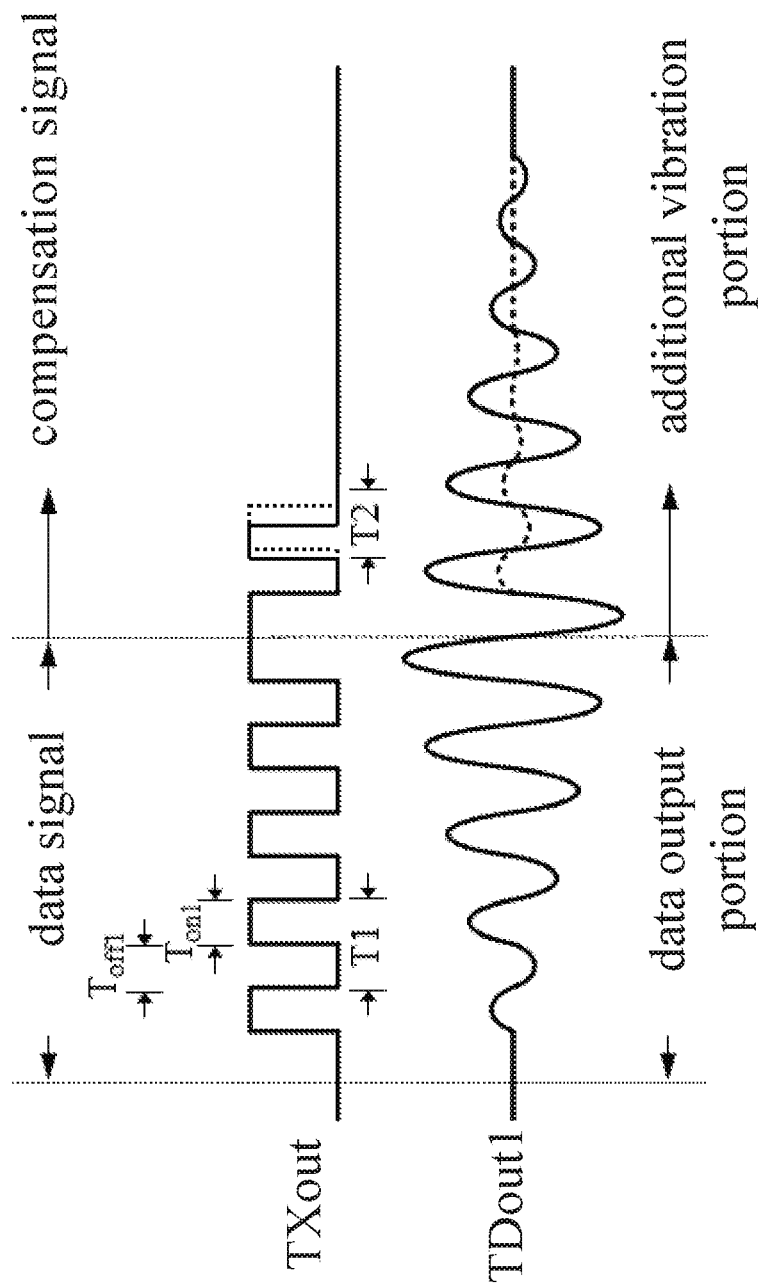
FIG. 10 shows the waveforms of the transmission signal generated by the present signal generation circuit and the first transducer output signal generated by the transmission signal passing through the first transducer in a time domain, according to the sixth embodiment of the present disclosure.

FIG. 10 shows the waveforms of the transmission signal TXout generated by the present signal generation circuit 100 and the first transducer output signal TDout1 generated by the transmission signal passing through the first transducer 102 in a time domain, according to a sixth embodiment of the present application. The embodiment shown in FIG. 9 differs from the case depicted in FIGS. 3 and 4 in that the frequency of the second pulse wave of the compensation signal can be adjusted, so as to address the issue seen in FIG. 4 that the energy of the second one of the second pulse waves is too great. In other words, in FIG. 10, the two second pulse waves still have a phase difference of 180 degrees with respect to the first pulse wave; yet, their frequency, one of the waveform parameters, differs from each other; for example, in FIG. 10, the second one of the second pulse waves has a frequency smaller than the frequency of the first pulse wave of the data signal (as is evidenced from the period T2 smaller than T1). As could be seen in FIG. 10, compared with the additional vibration portion generated after the incorporation of the compensation signal shown in FIG. 3 (the dashed line portion of the additional vibration portion), in FIG. 10, the additional vibration portion generated after the incorporation of the compensation signal (the dashed line portion of the additional vibration portion) may have an amplitude that can be lowered to a predetermined level during a shorter period of time.

It should be noted that the number of the second pulse wave of the compensation signal is not particularly limited in the present application, and it is feasible to adjust the frequency of part or all of the plurality of second pulse waves of the compensation signal with different levels of adjustment.

The embodiment in FIG. 10 can also be implemented using the signal generation unit illustrated in FIG. 6; that is, the cycle of the second pulse wave of the compensation signal can be changed by adjusting the specific multiple; for example, the specific multiple $N_1 \sim N_{k-3}$ is 3, the specific multiple $N_{k-2}$ is 6, and the specific multiple $N_{k-1} \sim N_k$ is 2. Therefore, the period of the first pulse wave of the data signal is the third multiple (such as, 3) of the period of the clock CLK, the period of the second pulse wave of the compensation signal is the fourth multiple (such as, 2) of the period of the clock CLK, and the third multiple and fourth multiple may be different positive integers.

Figure 11:
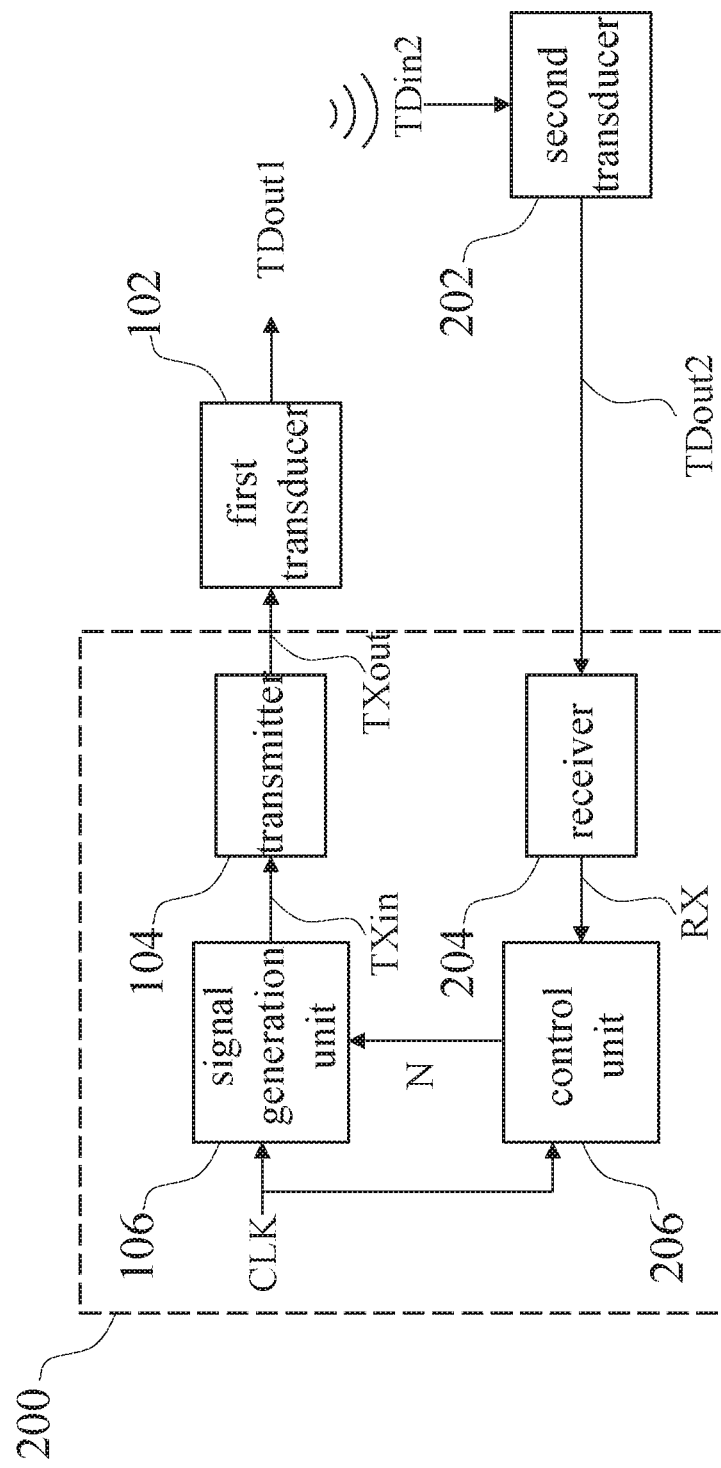
FIG. 11 is a schematic diagram illustrating the present signal generation circuit, according to another embodiment of the present application.

FIG. 11 is a schematic diagram illustrating a present signal generation circuit 200, according to embodiments of the present application. The signal generation circuit 200 is configured to generate a transmission signal TXout to trigger first transducer 102, and the first transducer 102, upon being triggered, generates a first transducer output signal TDout1, and the first transducer output signal TDout1 is transmitted to second transducer 202 (which becomes a second transducer input signal TDin2) via a medium. The second transducer 202 receives the second transducer input signal TDin2 and generates a second transducer output signal TDout 2 to the signal generation circuit 200 to form a closed loop, thereby adapting self-adjustment. The signal generation circuit 200 differs from the signal generation circuit 100 shown in FIG. 2 by further including a receiver 204 and a control unit 206.

Specifically, the receiver 204 receives the second transducer output signal TDout 2 and converts the same into a receiving signal RX, and the control unit 206 is coupled to the receiver 204 and the signal generation unit 106, wherein the control unit 206 generates a control signal (such as, the specific parameter N) to the signal generation unit 106 according to the receiving signal RX and the specific clock CLK, so that the signal generation unit 106 generates an output signal TXin according to the control signal (such as, the specific parameter N) and the specific clock CLK. It should be noted that the control unit 206 may determines the control signal (such as, the specific parameter N) by referencing the additional vibration portion of the first transducer output signal TDout1; in other words, by the self-adjustment of the closed loop, the compensation of the additional vibration portion of the first transducer output signal TDout1 gradually converges.

The present application also provides a chip, which includes the signal generation circuit 100 or the signal generation circuit 200.

In some embodiments, the signal generation circuit 100/200 is applicable in a sensing device; for example, the present application also provides a flow meter, which includes the signal generation circuit 100 and a first transducer 102; the present application also provides a flow meter, which includes the signal generation circuit 200, the first transducer 102 and a second transducer 202. For example, the above-mentioned flow meter can be used to detect the flow velocity and/or flow rate of gas and liquid; however, the present application is not limited thereto.

According to embodiments of the present application, the signal generation circuit and related chip, flow meter and method for triggering the transducer can reduce the additional vibration portion outputted by the transducer and reduce hardware cost and processing time.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. A signal generation circuit, configured to generate a transmission signal to trigger a first transducer to generate a first transducer output signal, wherein the signal generation circuit comprises:
   a signal generation unit, configured to generate an output signal; and
   a transmitter, coupled to the signal generation unit, wherein the transmitter is configured to convert the output signal into the transmission signal and output the transmission signal;
   wherein the transmission signal comprises a data signal and a compensation signal, wherein the data signal comprises at least a first pulse wave, and the compensation signal comprises at least a second pulse wave, wherein the first pulse wave and the second pulse wave have opposite phases, and the first pulse wave has an other waveform parameter different from an other waveform parameter of the second pulse wave; and
   wherein the signal generation unit generates the output signal according to a specific clock, wherein the specific clock has a specific period, a high-level time length of the first pulse wave is M times the specific period, wherein M is a positive integer.

2. The signal generation circuit of claim 1, wherein the first transducer output signal comprises a data output portion and an additional vibration portion, wherein the additional vibration portion continues the data output portion in a time domain, a time length of the data output portion of the first transducer output signal and a time length of the data signal of the transmission signal are the same, and the compensation signal is configured to reduce a time length consumed by the additional vibration portion to decrease from a peak value to a predetermined level.

3. The signal generation circuit of claim 1, wherein an inverted signal of the first pulse wave and the second pulse wave have different duty cycles.

4. The signal generation circuit of claim 3, wherein a high-level time length of the second pulse wave is N times the specific period, wherein M and N are different positive integers.

5. The signal generation circuit of claim 1, wherein an inverted signal of the first pulse wave and the second pulse wave have different slew rates.

6. The signal generation circuit of claim 1, wherein an inverted signal of the first pulse wave and the second pulse wave have different amplitudes.

7. The signal generation circuit of claim 1, wherein an inverted signal of the first pulse wave and the second pulse wave have different frequencies.

8. The signal generation circuit of claim 7, wherein the signal generation unit generates the output signal according to a specific clock, wherein the specific clock has a specific period, a period of the first pulse wave is P times the period of the specific period, and a period of the second pulse wave is Q times the period of the specific period, wherein P and Q are different positive integers.

9. The signal generation circuit of claim 4, wherein the signal generation unit comprises:
   a frequency divider, configured to divide a frequency of the specific clock according to a specific multiple, so as to generate a frequency-division signal; and
   a computation unit, configured to generate the output signal according to the frequency-division signal.

10. The signal generation circuit of claim 9, wherein the computation unit comprises:
- an exclusive OR circuit, comprising a first input terminus, a second input terminus and an output terminus; and
- a trigger circuit, comprising a clock input terminus, a data input terminus and an output terminus;
- wherein, the output signal is outputted from the output terminus of the trigger circuit, the output terminus of the trigger circuit is coupled to the first input terminus of the exclusive OR circuit, the second input terminus of the exclusive OR circuit is coupled to the frequency-division signal, the clock input terminus of the trigger circuit is coupled to the specific clock, the data input terminus of the trigger circuit is coupled to the output terminus of the exclusive OR circuit.

11. The signal generation circuit of claim 2, wherein the signal generation circuit further comprises:
- a control unit, configured to control the signal generation unit to generate the output signal according to the additional vibration portion.

12. The signal generation circuit of claim 11, further configured to receive a second transducer output signal from a second transducer, wherein the second transducer receives the first transducer output signal to generate the second transducer output signal, and the signal generation circuit further comprises:
- a receiver, configured to receive the second transducer output signal and convert the thus-received second transducer output signal into a receiving signal; and
- a control unit, coupled to the receiver and the signal generation unit, wherein the control unit generates a control signal to the signal generation unit according to the receiving signal.

13. A chip, comprising:
- a signal generation circuit, configured to generate a transmission signal to trigger a first transducer to generate a first transducer output signal,
- the signal generation circuit comprises:
  - a signal generation unit, configured to generate an output signal; and
  - a transmitter, coupled to the signal generation unit, wherein the transmitter is configured to convert the output signal into the transmission signal and output the transmission signal;
- wherein the transmission signal comprises a data signal and a compensation signal, wherein the data signal comprises at least a first pulse wave, and the compensation signal comprises at least a second pulse wave, wherein the first pulse wave and the second pulse wave have opposite phases, and the first pulse wave has an other waveform parameter different from an other waveform parameter of the second pulse wave; and
- wherein the signal generation unit generates the output signal according to a specific clock, wherein the specific clock has a specific period, a high-level time length of the first pulse wave is M times the specific period, wherein M is a positive integer.

14. A flow meter, comprising:
the signal generation circuit according to claim 1; and
the first transducer;
wherein the signal generation circuit is coupled to the first transducer.

15. A signal generate method for use in generating a transmission signal to trigger a first transducer to generate a first transducer output signal, wherein the signal generation method comprises:
- generating an output signal according to a specific clock; and
- converting the output signal into the transmission signal;
- wherein the transmission signal comprises a data signal and a compensation signal, wherein the data signal comprises at least one first pulse wave, and the compensation signal comprises at least one second pulse wave, wherein the first pulse wave and the second pulse wave have opposite phases, and the first pulse wave has an other waveform parameter different from an other waveform parameter of the second pulse wave; and
- wherein the specific clock has a specific period, a high-level time length of the first pulse wave is M times the specific period, wherein M is a positive integer.

16. The signal generation method of claim 15, wherein the first transducer output signal comprises a data output portion and an additional vibration portion, the additional vibration portion continues the data output portion in a time domain, the time length of the data output portion of the first transducer output signal and the time length of the data signal of the transmission signal are the same, and the compensation signal is configured to reduce a time length consumed by the additional vibration portion to decrease from a peak value to a predetermined level.

17. The signal generation method of claim 15, wherein an inverted signal of the first pulse wave and the second pulse wave have different duty cycles.

18. The signal generation method of claim 15, wherein an inverted signal of the first pulse wave and the second pulse wave have different slew rates.

19. The signal generation method of claim 15, wherein an inverted signal of the first pulse wave and the second pulse wave have different amplitudes.

20. The signal generation method of claim 15, wherein an inverted signal of the first pulse wave and the second pulse wave have different frequencies.

* * * * *